(12) United States Patent
Brown

(10) Patent No.: US 9,966,280 B2
(45) Date of Patent: May 8, 2018

(54) PROCESS GAS GENERATION FOR CLEANING OF SUBSTRATES

(71) Applicant: TOKYO ELECTRON LIMITED, Tokyo (JP)

(72) Inventor: Ian J Brown, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 844 days.

(21) Appl. No.: 13/783,382

(22) Filed: Mar. 3, 2013

(65) Prior Publication Data

US 2014/0096792 A1 Apr. 10, 2014

Related U.S. Application Data

(60) Provisional application No. 61/710,657, filed on Oct. 5, 2012.

(51) Int. Cl.
*H01L 21/67* (2006.01)
*H01L 21/02* (2006.01)
(Continued)

(52) U.S. Cl.
CPC ...... *H01L 21/67017* (2013.01); *B08B 7/0057* (2013.01); *H01L 21/67028* (2013.01);
(Continued)

(58) Field of Classification Search
None
See application file for complete search history.

(56) References Cited

U.S. PATENT DOCUMENTS 5,677,113 A 10/1997 Suzuki et al.
5,709,754 A 1/1998 Morinville et al.
(Continued)

FOREIGN PATENT DOCUMENTS

CN 1294481 A 5/2001
CN 1783479 A 6/2006
(Continued)

OTHER PUBLICATIONS

European Patent Office, International Search Report and Written Opinion issued in corresponding Application No. PCT/US2013/059601, dated Jan 17, 2014, 13 pp.
(Continued)

*Primary Examiner* — Mikhail Kornakov
*Assistant Examiner* — Pradhuman Parihar
(74) *Attorney, Agent, or Firm* — Wood Herron & Evans LLP

(57) ABSTRACT

Provided is a method and system for cleaning a substrate with a cleaning system comprising a pre-treatment system and a wet clean system. One or more objectives for the pre-treatment system are selected and two or more pre-treatment operating variables including UV dose, substrate temperature, oxygen partial pressure, oxygen and ozone partial pressure, and/or total pressure, are optimized to meet the pre-treatment objectives, using metrology measurements. The substrate includes a layer to be cleaned and an underlying dielectric layer having a k-value. A pre-treatment gas comprising oxygen and/or ozone is delivered onto a surface of the substrate and irradiated with a UV device, generating oxygen radicals. Cleaning of the substrate in the pre-treatment process is set at less than 100% in order to ensure the change in k-value of the substrate is within a set range for the substrate application.

33 Claims, 11 Drawing Sheets

(51) Int. Cl.
*H01L 21/66* (2006.01)
*B08B 7/00* (2006.01)
(52) U.S. Cl.
CPC .. H01L 21/67051 (2013.01); H01L 21/67253 (2013.01); H01L 22/20 (2013.01); *H01L 21/0206* (2013.01); *H01L 22/12* (2013.01)

(56) References Cited

U.S. PATENT DOCUMENTS

| | | | | |
|---|---|---|---|---|
| 5,803,975 | A | * | 9/1998 | Suzuki ............... 118/723 MW |
| 6,143,477 | A | * | 11/2000 | Rhieu ..................... 430/329 |
| 6,503,693 | B1 | | 1/2003 | Mohondro et al. |
| 6,524,936 | B2 | | 2/2003 | Hallock et al. |
| 6,715,498 | B1 | * | 4/2004 | Humayun et al. ............ 134/1.3 |
| 7,837,821 | B2 | | 11/2010 | Zhou et al. |
| 2001/0017142 | A1 | * | 8/2001 | Suzuki ..................... 134/1 |
| 2005/0279380 | A1 | * | 12/2005 | Elliott et al. .................. 134/1.1 |
| 2006/0091559 | A1 | | 5/2006 | Nguyen et al. |
| 2008/0078987 | A1 | * | 4/2008 | Leusink ..................... 257/19 |
| 2008/0268214 | A1 | * | 10/2008 | Hayes et al. ............... 428/210 |
| 2009/0293907 | A1 | * | 12/2009 | Fung et al. ................. 134/1.2 |
| 2010/0282271 | A1 | * | 11/2010 | Devitt ..................... 134/1 |
| 2011/0306213 | A1 | * | 12/2011 | Wang et al. .................. 438/708 |
| 2012/0052687 | A1 | | 3/2012 | Raghavan et al. |
| 2012/0077347 | A1 | | 3/2012 | Metz et al. |
| 2012/0160273 | A1 | | 6/2012 | Mizutani et al. |
| 2012/0208377 | A1 | * | 8/2012 | Timans ..................... 438/799 |
| 2013/0330920 | A1 | * | 12/2013 | Liu et al. .................... 438/608 |

FOREIGN PATENT DOCUMENTS

| | | | |
|---|---|---|---|
| JP | 11323576 | | 11/1999 |
| JP | 2001118818 | A | 4/2001 |
| JP | 2005129733 | A | 5/2005 |
| JP | 05224167 | B2 | 7/2013 |
| TW | 200832495 | A | 8/2008 |
| TW | 201216360 | A | 4/2012 |
| TW | 201237951 | A | 9/2012 |
| WO | 2004001808 | A2 | 12/2003 |

OTHER PUBLICATIONS

Butterbaugh, FSI International Presentation at the Surface Preparation and Cleaning Conference in Austin, Texas on May 4, 2006.
Govindarajan, PhD Thesis, "Effect of pretreatment of high dose implanted resists by Uv activated hydrogen peroxide solutions for their effective removal by conventional (Continued) sulfuric-peroxide mixtures", Department of Materials Science and Engineering, University of Arizona.
U.S. Appl. No. 13/414,55, filed Mar. 7, 2012, by Brown, I J.
U.S. Appl. No. 13/413,620, filed Mar. 6, 2012, by Brown, I J.
U.S. Appl. No. 13/413,620, filed Mar. 6, 2012, by Brown, I J published as US2012/0247505 dated Oct. 4, 2012.
Taiwan Intellectual Property Office, Rejection Decision issued in corresponding Taiwan Application No. 102135907 dated Feb. 23, 2016, 20 pages, including English translation.
State Intellectual Property Office of People'S Republic of China, First Office Action issued in corresponding Chinese Patent Application No. 2016122501316400, dated Dec. 30, 2015, 15 pages (including English translation).
Taiwan Intellectual Property Office, Notification of Examination Opinion issued in corresponding Taiwan Application No. 102135907 dated Jun. 25, 2015, 22 pages, including English translation.
State Intellectual Property Office of Peoples Republic of China, Office Action issued in counterpart Chinese Application No. 2013800063928.8 dated Oct. 8, 2016, 18 pages, including English translation.
Korean Intellectual Property Office, Final Office Action issued in counterpart Korean Application No. 10-2015-7011733 dated Nov. 21, 2016, 7 pages, including English translation.
Korean Intellectual Property Office, Office Action issued in counterpart Kaman Application No. 10-2015-7011733 dated Jan. 16, 2017, 6 pages, including English translation.
State Intellectual Property Office, Second Office Action issued in counterpart Chinese Application No. 2013800063928.8 dated May 5, 2016, 18 pages, including English translation.
Korean Intellectual Property Office, Office Action issued in counterpart Korean Application No. 10-2015-7011733 dated Apr. 26, 2016, 22 pages, including English translation.
Japan Patent Office, Office Action issued in corresponding JP Application No. 2015-535666 dated Aug. 8, 2016, 10 pp. including English translation.

* cited by examiner

PROCESS GAS GENERATION FOR CLEANING OF SUBSTRATES

Pursuant to 37 C.F.R. § 1.78(a)(4), this application claims the benefit of and priority to prior filed Provisional Application Ser. No. 61/710,657 entitled "PROCESS GAS GENERATION FOR CLEANING OF SUBSTRATES", filed on Oct. 5, 2012, which is expressly incorporated herein by reference.

FIELD

The present application generally relates to semiconductor processing and specifically to a substrate cleaning process comprising a pre-treatment process with a process gas and a wet clean process.

RELATED ART

Highly fluorinated polymers are created in reaction ion etch (RIE) patterning processes for low-k dielectrics where k-value is within the range of 2.0-2.6. Ultra-violet (UV) pre-treatment has been demonstrated to improve the polymer removal ability of typical back-end-of line (BEOL) post etch processing using compatible cleaning solvents. UV irradiation in the presence of oxygen has been used for an effective pre-treatment process prior to a wet clean process. Partial pressures of oxygen with low pressure ranges have been shown as an effective approach. Low pressure mercury, Hg, lamps are capable of performing this process. Low pressure Hg lamps have two dominant emission wavelengths: 254 nm and 185 nm. The 185 nm radiation has sufficient energy to break-up oxygen to form oxygen atoms which in turn react with oxygen to form ozone. The 254 nm radiation is absorbed by ozone to generate oxygen atoms. However, use of the 185 nm radiation results in an undesirable increase in the k-value of the film after processing. The challenge is that 185 nm radiation has sufficient energy to chemically activate and destroy the underlying low-k dielectric.

Ozone free Hg lamps are available, (i.e., only 254 nm), but the pre-treatment performance is not as good as ozone generating Hg lamps, (254 nm and 185 nm). Some previous cleaning systems use excimer lamps, for example, one excimer lamp directing the light less than 190 nm into the oxygen gas causing generation of ozone and another excimer lamp directing light into the ozone gas, causing generation of an oxygen radical having a high absorption coefficient. Gas including the oxygen radical is passed along the surface of the substrate to cause degeneration of the organic material thereon. Other approaches use lasers that can be generated by an excimer laser which provides UV energy for driving an oxidation reaction to decompose the resist or organic materials into byproducts such as CO, $CO_2$, and $H_2O$ that are continuously exhausted by an exhaust pump. Other dry etching techniques can also be used to clean the substrate but such techniques are typically followed with a wet clean process. The use of eximer lamps, lasers or the use of thermal ozone process generation requires the use of expensive equipment and processes.

There is a need to clean the post etch polymer while controlling the change of k-value or damage to the underlying dielectric film in a front-end-of-line (FEOL) or back-end-of-line (BEOL) process. In addition, there are needs for (a) reduced cost of ownership for a pre-treatment process followed by wet clean process, and (b) a simplified hardware system that reduces the number and complexity of delivery systems for process gas and treatment fluids.

SUMMARY

Provided is a method and system for cleaning a substrate with a cleaning system comprising a pre-treatment system and a wet clean system. One or more objectives for the pre-treatment system are selected and two or more pre-treatment operating variables including UV dose, substrate temperature, oxygen partial pressure, oxygen and ozone partial pressure, and/or total pressure, are optimized to meet the pre-treatment objectives, using metrology measurements. The substrate includes a layer to be cleaned and an underlying dielectric layer having a k-value. A pre-treatment gas comprising oxygen and/or ozone is delivered onto a surface of the substrate and irradiated with a UV device, generating oxygen radicals. Cleaning of the substrate in the pre-treatment process is set at less than 100% in order to ensure the change in k-value of the substrate is within a set range for the substrate application.

LIST OF FIGURES

Figure 6A:
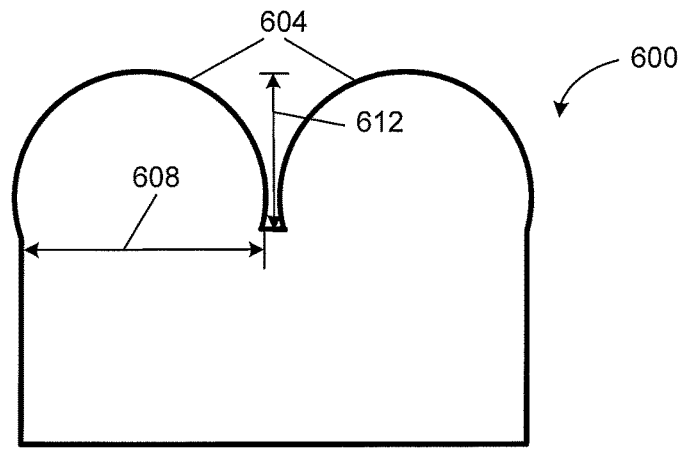
Figure 6B:
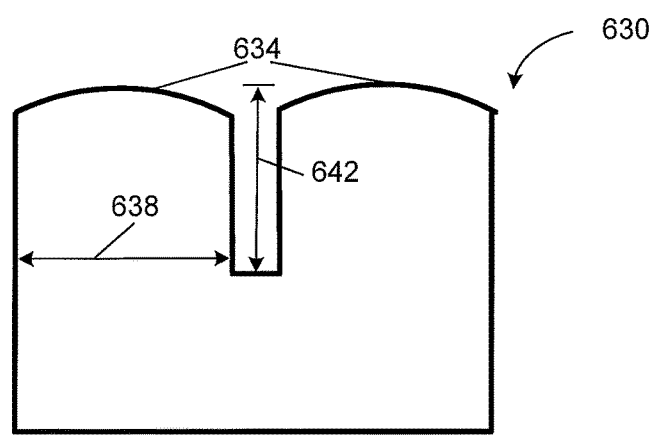
Figure 6C:
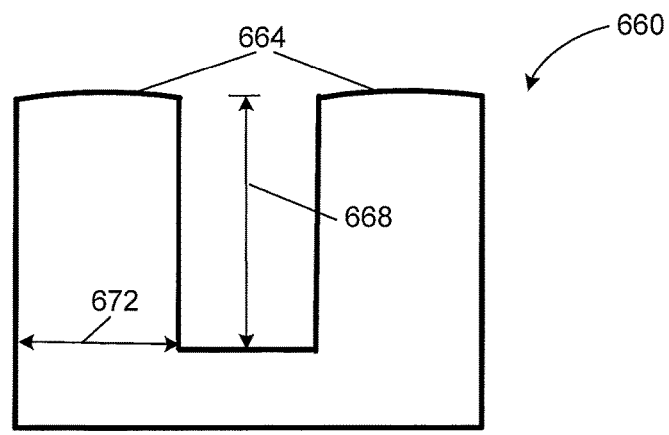

FIG. 6A depicts an exemplary side-view image of a substrate before the UV irradiation of the substrate with oxygen. FIG. 6B depicts an exemplary side-view image of the substrate after the pre-treatment process. FIG. 6C is an exemplary side-view image of the substrate after the pre-treatment process and a wet clean process.

Figure 7:
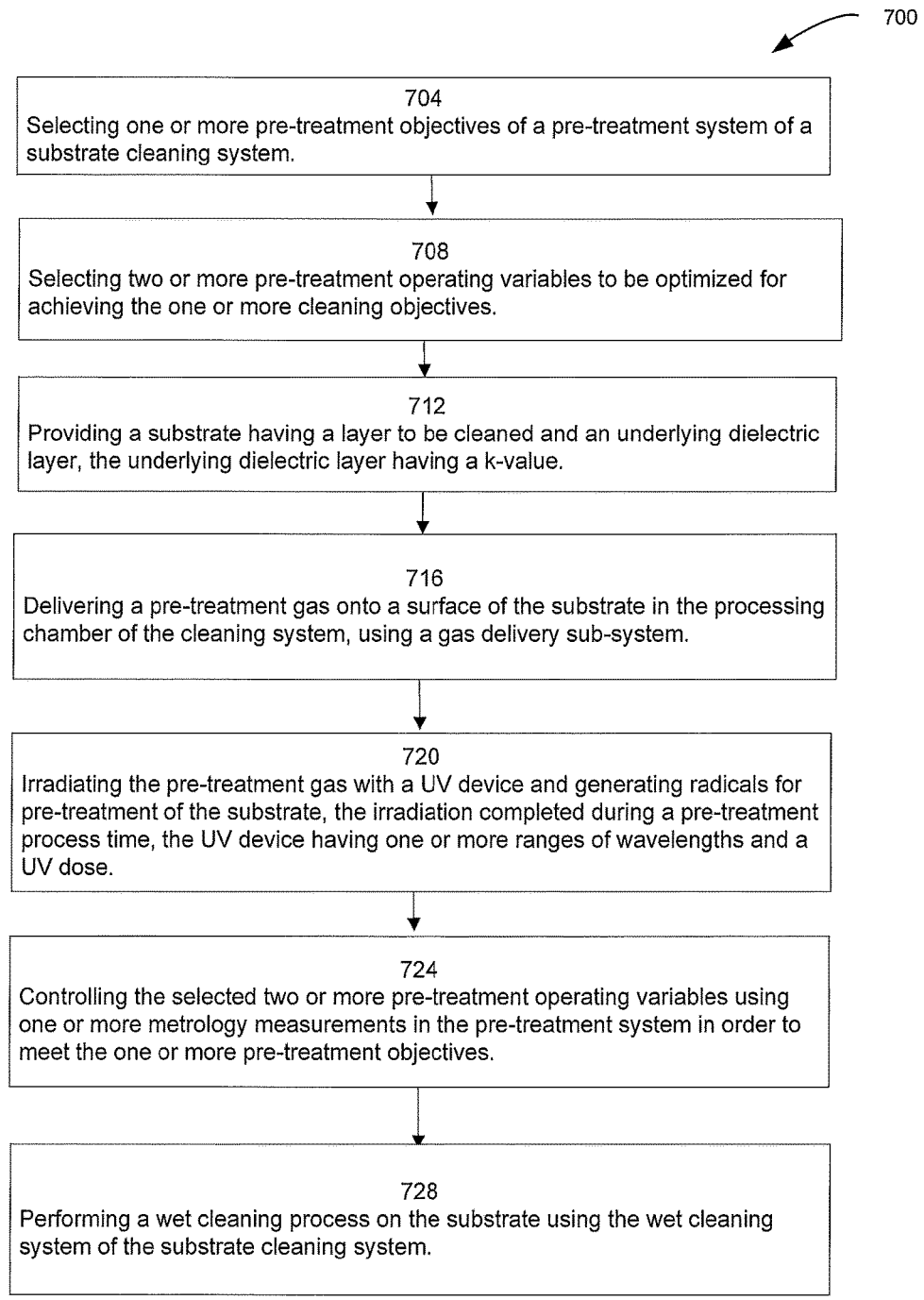

FIG. 7 is an exemplary flow chart for a method of cleaning a substrate comprising a pre-treatment process using UV light and a wet clean process in an embodiment of the present invention.

Figure 8:
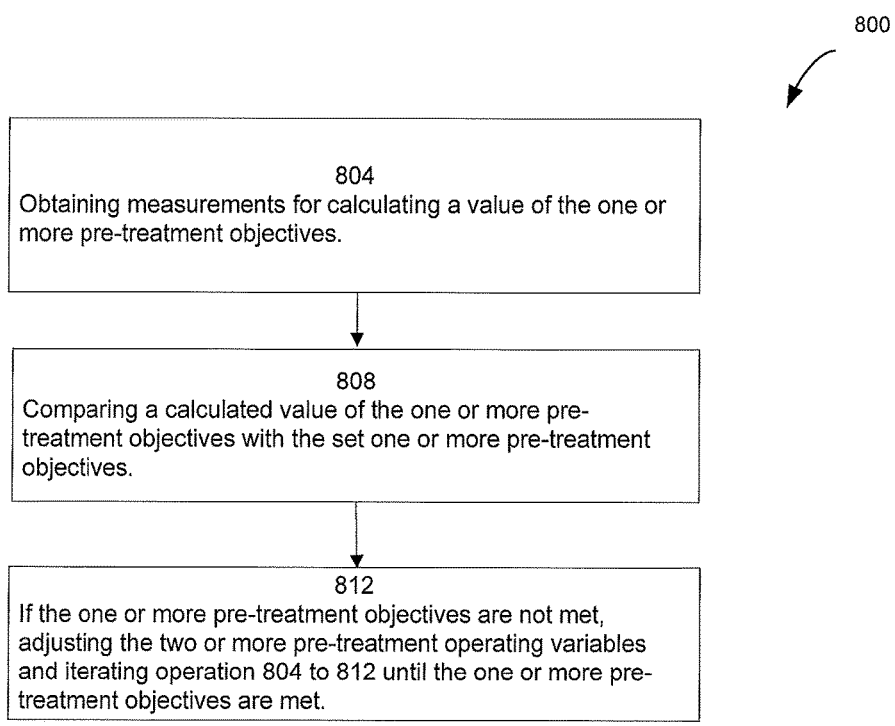

FIG. 8 is an exemplary flow chart of a method of controlling a cleaning system using selected cleaning operating variables in an embodiment of the present invention.

Figure 9:
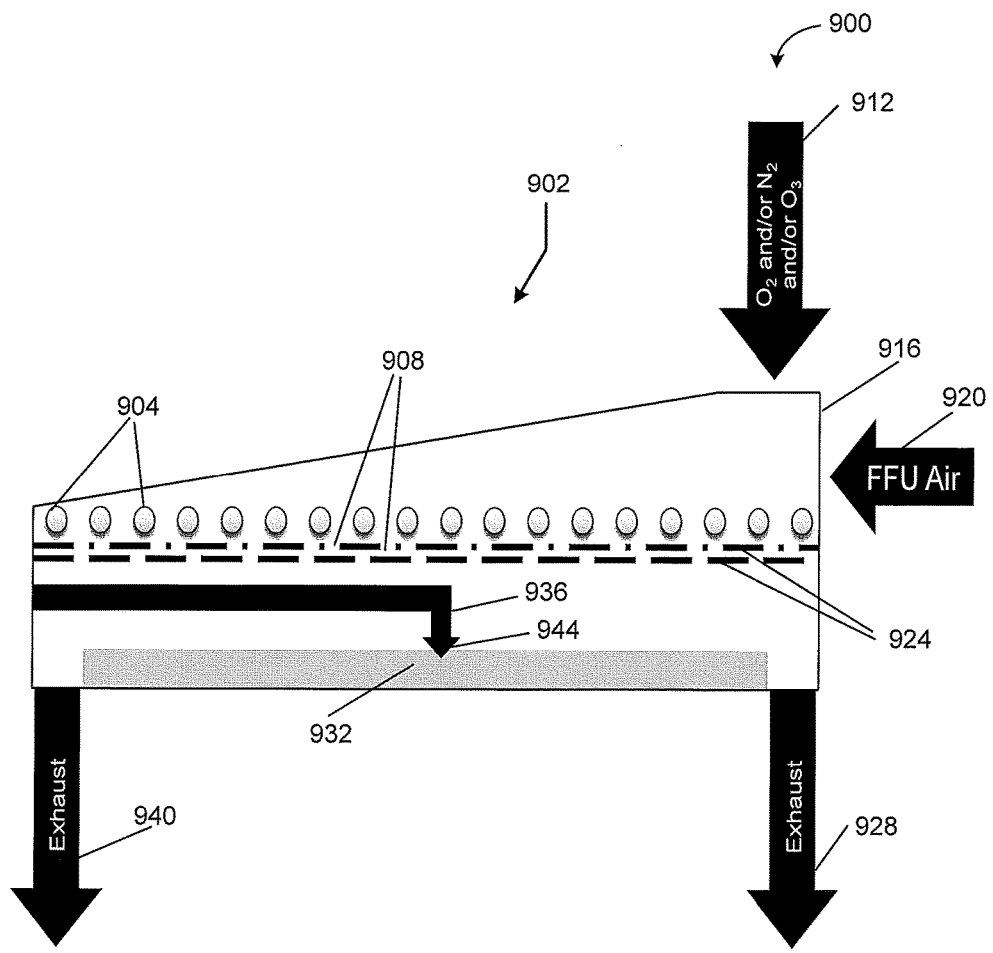

FIG. 9 is an exemplary diagram for a cleaning system where the UV source is located above a diffusion plate, the diffusion plate configured to block 185 nm wavelength light and allow other wavelength light to irradiate the substrate during the pre-treatment process and configured to protect the UV source and associated equipment during the subsequent wet clean process.

Figure 10:
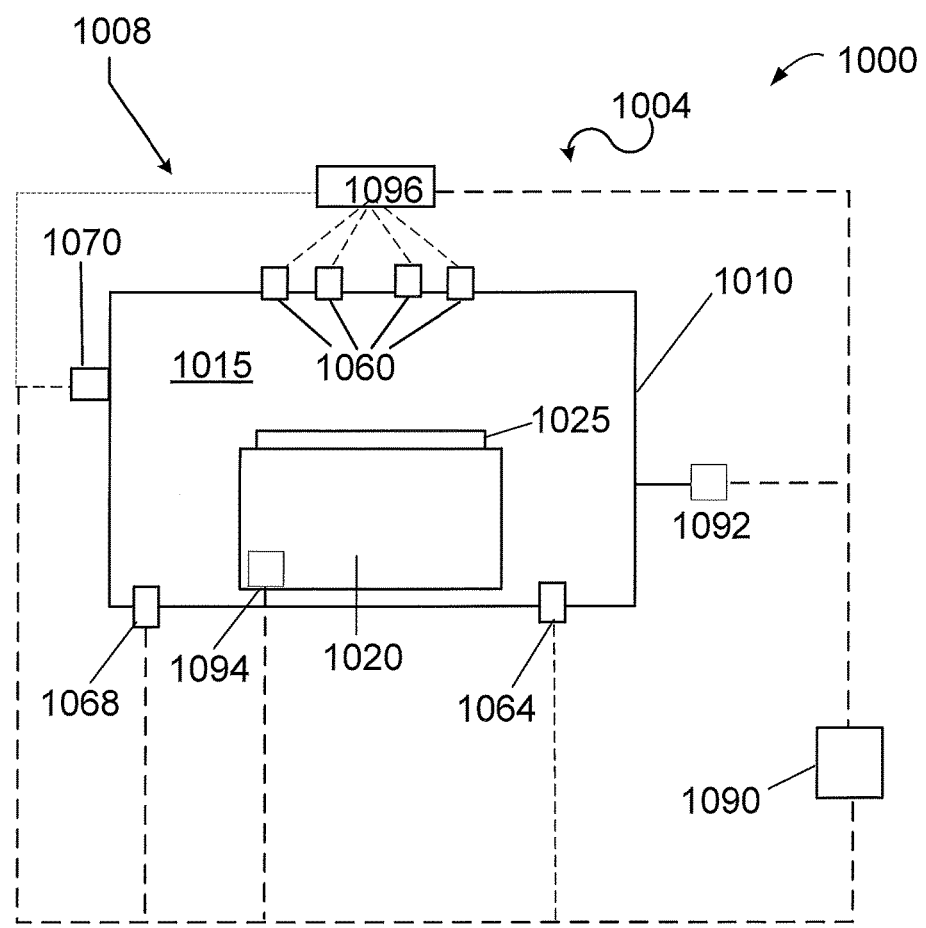

FIG. 10 is an exemplary architectural diagram of a cleaning system depicting use of a controller for optimizing the operating variables of the cleaning system to meet cleaning objectives.

DETAILED DESCRIPTION OF EXEMPLARY EMBODIMENTS

Figure 1A:
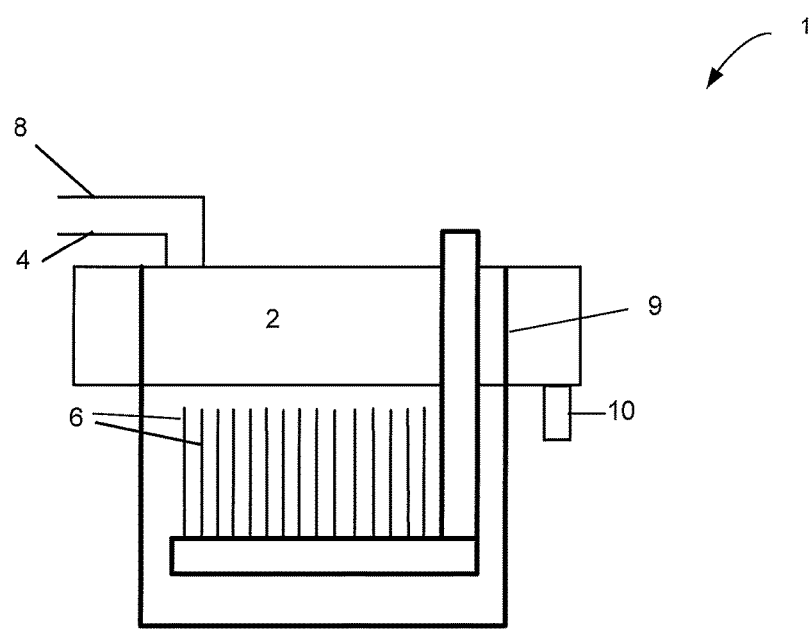
FIG. 1A is an architectural diagram illustrating a prior art method of resist stripping in a batch etch process.

FIG. 1A is an architectural diagram illustrating a prior art method of resist stripping in a batch etch process. In order to facilitate the description of the present invention, a semiconductor substrate is utilized to illustrate applications of the concept. The methods and processes equally apply to other workpieces such as a wafer, disk, memory or the like. Similarly, aqueous sulfuric acid and hydrogen peroxide mixture may be utilized to illustrate a treatment liquid in the present invention. As mentioned below, other treatment liquids can alternatively be used. The treatment liquid can include primary, secondary, and tertiary chemicals, one or more process gas, and reaction products.

Referring to FIG. 1A, an architectural diagram 1 illustrates a prior art method and system of surface treatment, such as resist stripping in a batch etch process, where the etch chemicals (etchants) are dispensed using one or more input streams, 4 and 8, onto the etch processing chamber 9 where a plurality of substrates 6 are positioned. The etchants may be reused or recycled or disposed of using the overflow tank 2 and overflow spout 10. Heaters (not shown) can be provided, for example, by having heaters on the sides or at the bottom of the processing chamber 9. The heaters may be external or inline.

Figure 1B:
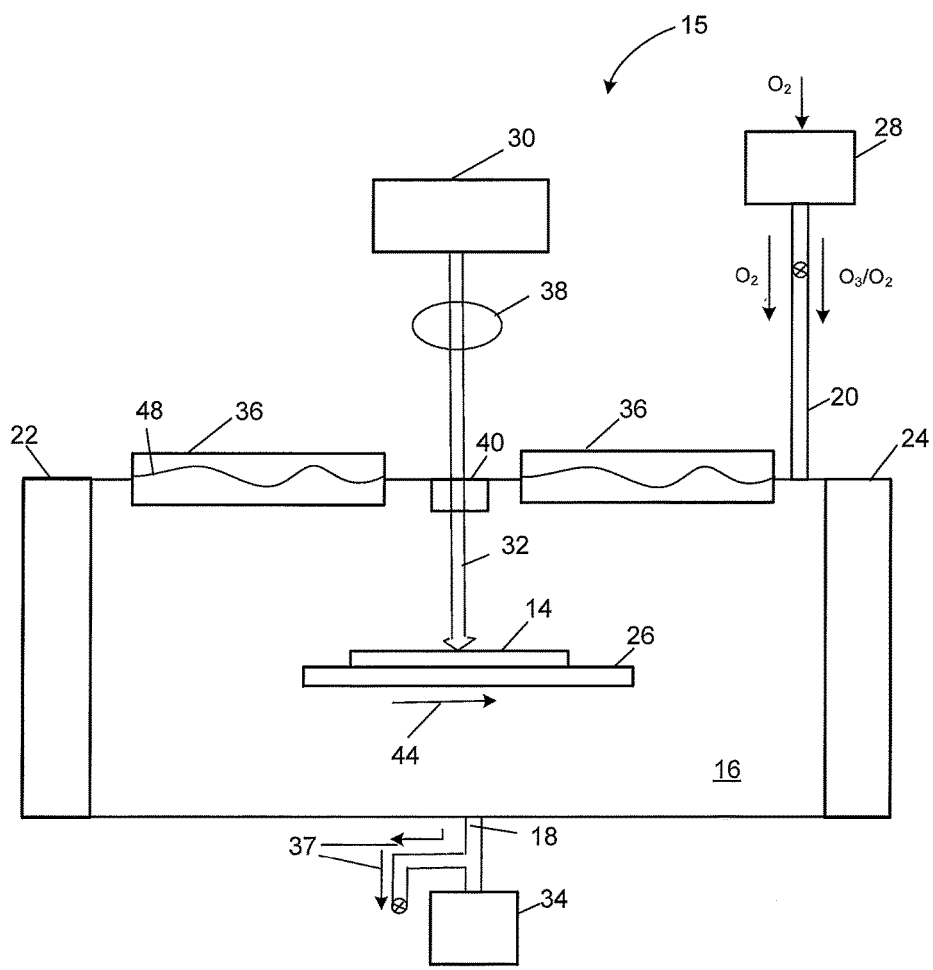
FIG. 1B is a diagram of a prior art apparatus for removing photoresist (resist) from a substrate using two or more passes of a UV laser beam in a reaction chamber.

FIG. 1B is a diagram of a prior art apparatus for removing photoresist (resist) from a substrate 14 using two or more passes of a UV laser beam 32 in a reaction chamber 16. An apparatus 15 for cleaning a layer of organic material from substrate 14, such as a resist or polymer, is shown, including a reaction chamber 16, where a supply conduit 20 for process gas such as $O_2$ or $O_3$ and $O_2$ are being supplied. The $O_3$ can be generated from $O_2$ input in-situ in an $O_3$ generator 28 or generated with the UV laser beam 32. The reaction chamber 16 has the means for generating $O_3$ using UV lamps 36 through quartz windows 48. The laser source 30 directs the UV laser beam 32 through a focusing lens 38 and a transparent window 40. The substrate 14 containing the layer to be cleaned is loaded by a substrate loader 22, moved past the UV laser beam 32 by conveyor 26 in the direction of movement 44 and unloaded by substrate unloader 24. The method of cleaning is done by moving the substrate 14 two or more times past the UV laser beam 32 until the substrate 14 is cleaned. Exhaust process gas is continuously pumped through the exhaust conduit 18 by the exhaust pump 34 as indicated by the exhaust arrows 37.

Figure 2:
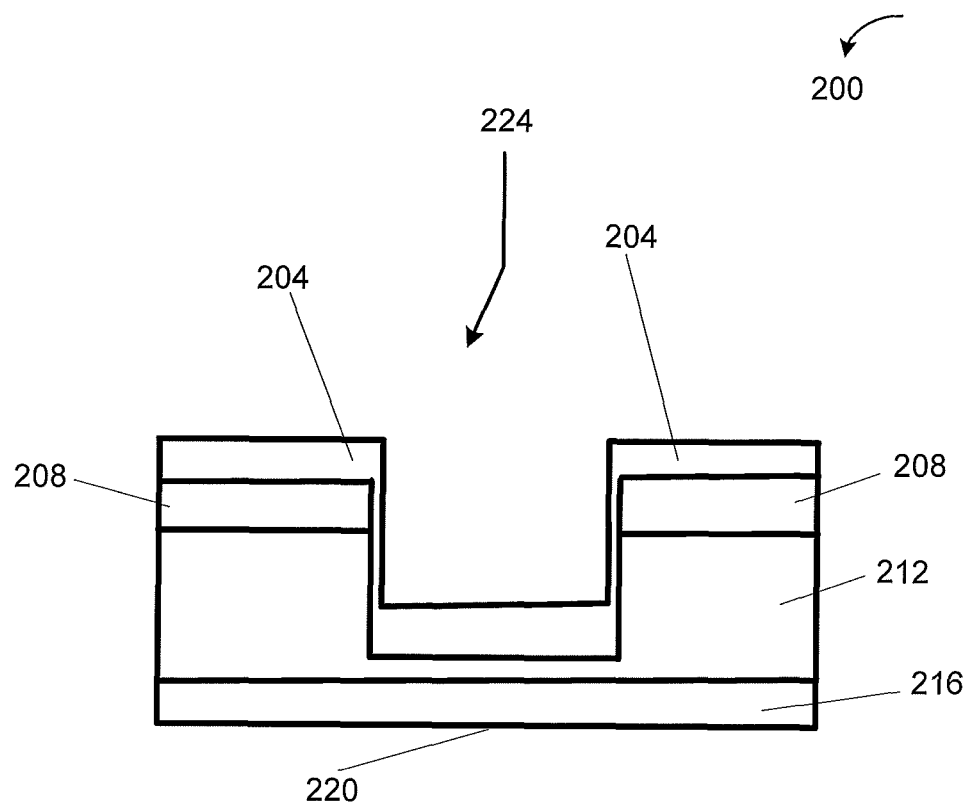
FIG. 2 is an exemplary side-view diagram of a polymer film and resist for low-k samples used in a pre-treatment process using UV light and a wet clean process.

FIG. 2 is an exemplary diagram 200 of layers of a low-k sample used in cleaning a substrate 224 using a pre-treatment process with UV light and a process gas followed by a wet clean process. The substrate 224 comprises a silicon layer 216, an advanced low k (ALK) dielectric film 212, where the k-value is in the range from 2.0 to 2.2. Other ranges of the k-value may also be used. Above the ALK dielectric film 212 is photoresist 208. The top conformal layer is polymer film 204 in the range of 60 to 70 nm. The cleaning of the substrate includes removal of the polymer film 204 and the photoresist 208 by the combined pre-treatment process and the wet etch process.

Figure 3:
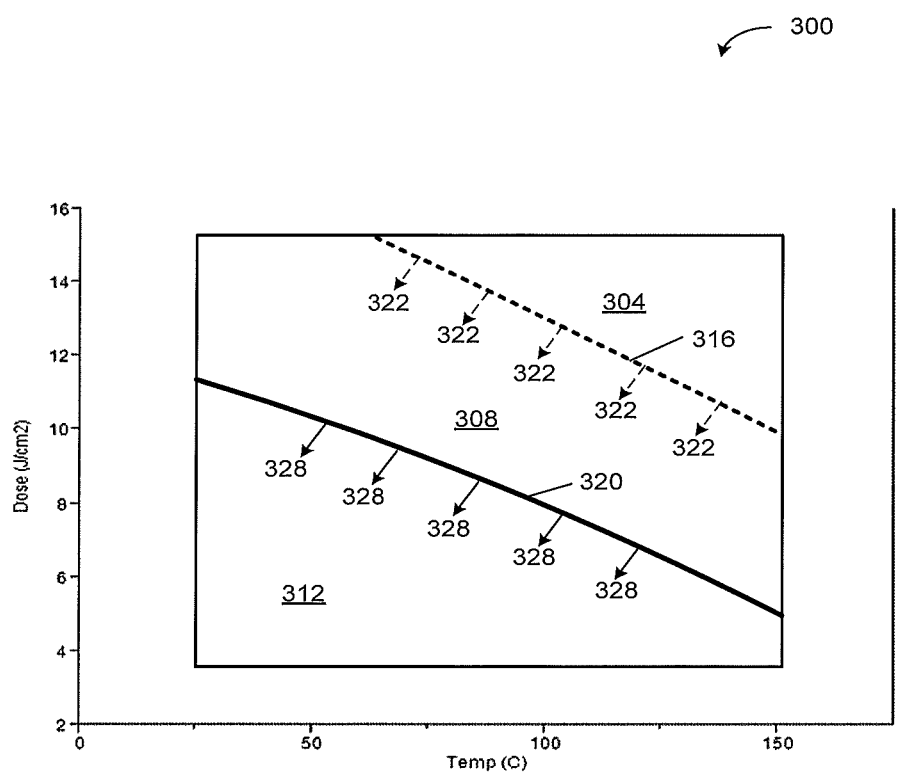
FIG. 3 depicts an exemplary graph of the cleaning operating window for substrate cleaning as a function of UV dose versus substrate temperature, the substrate cleaning comprising a pre-treatment process using UV light and a wet clean process using a base oxygen partial pressure.

FIG. 3 depicts an exemplary graph of the cleaning operating window 308 for substrate cleaning as a function of UV dose versus substrate temperature, the substrate cleaning comprising a pre-treatment process using UV light and a wet clean process using a base oxygen partial pressure. The cleaning operating window 308 is defined as the range of operating variables where the one or more objectives of the cleaning process are accomplished and where the oxygen partial pressure is kept constant at the base oxygen partial pressure. The base oxygen partial pressure is selected for the substrate application based on historical or simulation data. The cleaning operating window 308 is the area between the dotted line 316 and the solid line 320 represents points of UV dose and substrate temperature where the substrate is cleaned without any damage to the underlying dielectric. The area 312 bounded by the solid line 320 until the bottom of the graph represents points of UV dose and substrate temperature where the substrate has residual polymer not removed by the cleaning process. The area 304 bounded by the dotted line 316 and up represents points of UV dose and substrate temperature where the substrate is clean but the underlying dielectric is damaged or where the change in k-value exceeds the range of acceptable k-value changes. The dotted trend arrows 322 indicate that as the k-value of the dielectric goes down, area 304 tends to expand, i.e., more instances of clean but damaged substrates. The solid trend arrows 328 indicate that with greater post etch polymer thickness, there are more instances of residual polymer not being removed by the cleaning process.

Figure 4:
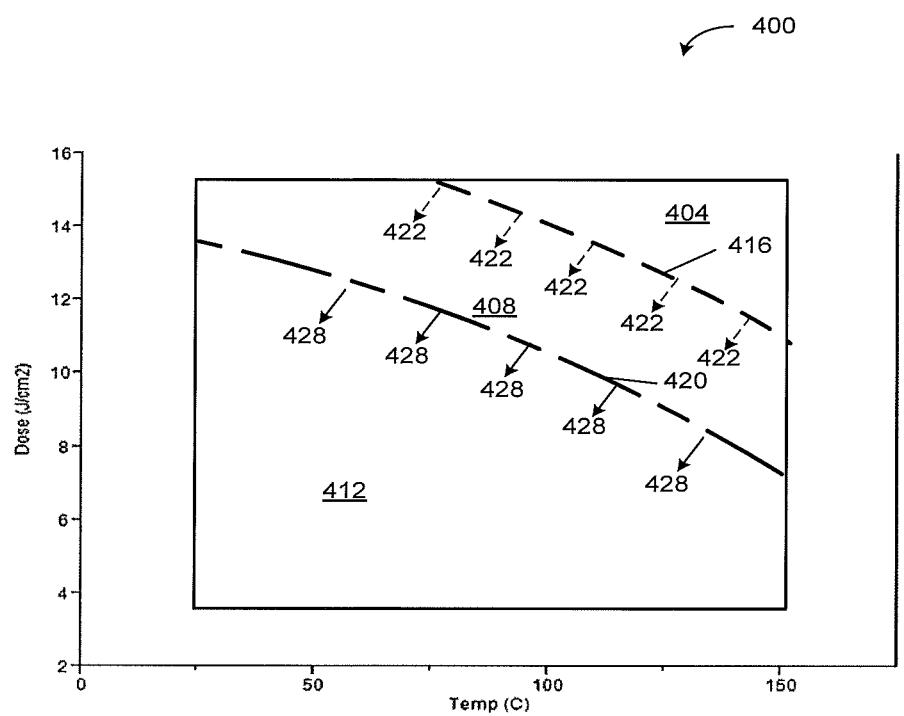
FIG. 4 depicts an exemplary graph of the cleaning operating window for substrate cleaning as a function of UV dose versus substrate temperature, the substrate cleaning comprising a pre-treatment process using UV light and a wet clean process using a higher oxygen partial pressure than the base oxygen partial pressure.

FIG. 4 depicts an exemplary graph of the cleaning operating window 408 for substrate cleaning as a function of UV dose versus substrate temperature, the substrate cleaning comprising a pre-treatment process using UV light and a wet clean process using a higher oxygen partial pressure than the base oxygen partial pressure. As mentioned above, the cleaning operating window 408 is defined as the range of operating variables where the one or more objectives of the cleaning process are accomplished and where the oxygen partial pressure is kept constant at a value higher than the base oxygen partial pressure of FIG. 3. The base oxygen partial pressure is selected for the substrate application based on historical or simulation data. The cleaning operating window 408 is the area between the short-dash line 416 and the long-and-short-dash line 420 represents points of UV dose and substrate temperature where the substrate is cleaned without any damage to the underlying dielectric. The area 412 bounded by the long-and-short-dash line 420 until the bottom of the graph represents points of UV dose and substrate temperature where the substrate has residual polymer not removed by the cleaning process. The area 404 bounded by the short-dash line 416 and up represents points of UV dose and substrate temperature where the substrate is clean but the underlying dielectric is damaged or where the change in k-value exceeds the range of acceptable k-value changes. The dotted trend arrows 422 indicate that as the k-value of the dielectric goes down, area 404 tends to expand, i.e., more instances of clean but damaged substrates. The solid trend arrows 428 indicate that with greater post etch polymer thickness, there are more instances of residual polymer not being removed by the cleaning process. It should be noted that the area 404 in FIG. 4 where the underlying dielectric is damaged or where the change in k-value exceeds the range of acceptable k-value changes is a much smaller area than a similar area 304 in FIG. 3. In contrast, the area 412 in FIG. 4 where the underlying dielectric is damaged or where the substrate has residual polymer not removed by the cleaning process in k-value exceeds the range of acceptable k-value changes is a much bigger area than a similar area 312 in FIG. 3.

Figure 5:
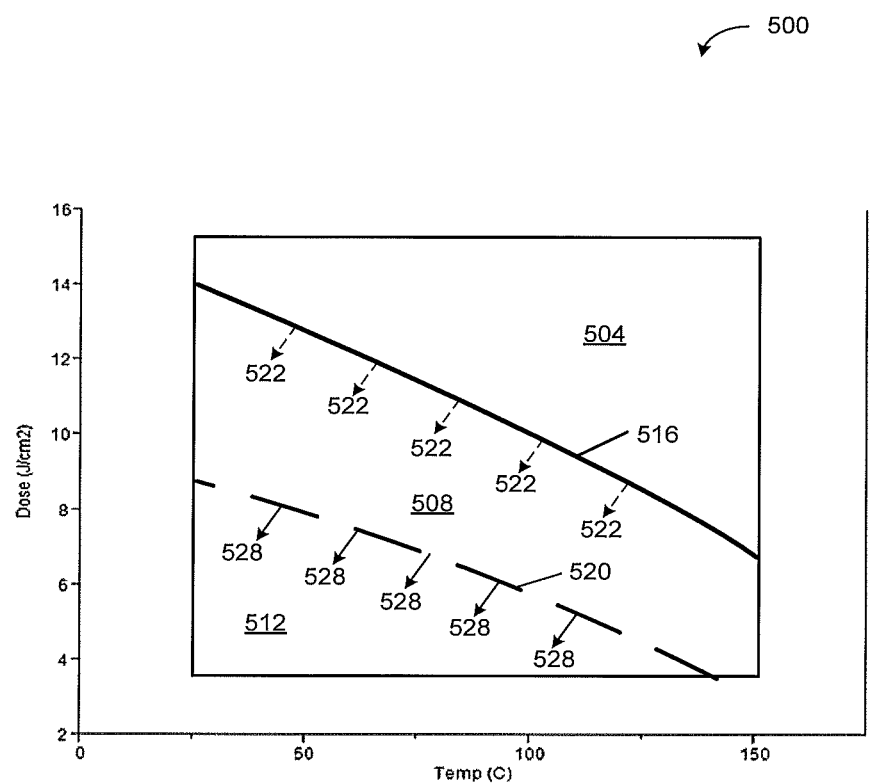
FIG. 5 depicts an exemplary graph of the cleaning operating window for substrate cleaning as a function of UV dose versus substrate temperature, the substrate cleaning comprising a pre-treatment process using UV light and a wet clean process using a lower oxygen partial pressure than the base oxygen partial pressure.

FIG. 5 depicts an exemplary graph of the cleaning operating window 508 for substrate cleaning as a function of UV dose versus substrate temperature, the substrate cleaning comprising a pre-treatment process using UV light and a wet clean process using a lower oxygen partial pressure than the base oxygen partial pressure in FIG. 3. As mentioned above, the operating window is defined as the range of operating variables where the one or more objectives of the cleaning process are accomplished and where the oxygen partial pressure is kept constant at a value lower than the base oxygen partial pressure of FIG. 3. The base oxygen partial pressure is selected for the substrate application based on historical or simulation data. The cleaning operating window 508 is the area between the solid line 516 and the long-dash line 520 represents points of UV dose and substrate temperature where the substrate is cleaned without any damage to the underlying dielectric. The area 512 bounded by the long-dash line 520 until the bottom of the graph represents points of UV dose and substrate temperature where the substrate has residual polymer not removed by the cleaning process. The area 504 bounded by the solid line 516 and up represents points of UV dose and substrate temperature where the substrate is clean but the underlying dielectric is damaged or where the change in k-value exceeds the range of acceptable k-value changes. The dotted trend arrows 522 indicate that as the k-value of the dielectric goes down, area 504 tends to expand, i.e., more instances of clean but damaged substrates. The solid trend arrows 528 indicate that with greater post etch polymer thickness, there are more instances of residual polymer not being removed by the cleaning process. It should be noted that the area 504 in FIG. 5 where the underlying dielectric is damaged or where the change in k-value exceeds the range of acceptable k-value changes is a much larger area than a similar area 304 in FIG. 3. In contrast, the area 512 in FIG. 5 where the underlying dielectric is damaged or where the substrate has residual polymer not removed by the cleaning process is a much smaller area than a similar area 312 in FIG. 3.

FIGS. 3, 4, and 5 highlight that the cleaning operating windows, (308, 408, and 508), are correlated at least to substrate temperature, UV dose in the pre-treatment process, oxygen partial pressure, total pressure, and the process gas used. The ranges of operating variables that cause damage to the underlying dielectric or cause incomplete polymer cleaning changes as these operating variables are changed. The change in k-value is a critical parameter that is selected for the substrate application. The k-value is the extinction coefficient and is related to the decay, or damping of the oscillation amplitude of the incident electric field of the dielectric underlying layer. The extinction coefficient k of a layer of the underlying dielectric layer, (k-value), is a function of substrate temperature and the pre-treatment process gas used. When UV light is not used, i.e., there is no pre-treatment process, the k-value of the underlying dielectric can be used as a base value for measuring the change in k-value. The k-value of the underlying dielectric layer as function of the oxygen gas partial pressure and can be measured with optical metrology devices such as reflectometers or ellipsometers. Methods and techniques for extracting k-value from reflectometer or ellipsometer measurements are well known in the art. The change in k-value of the layer of the substrate is jointly correlated to substrate temperature, the process gas used, the oxygen partial pressure, the total process gas pressure, and the UV dose. Thus, these cleaning operating variables need to be controlled to perform the cleaning and also meet an acceptable change in k-value target.

FIG. 6A depicts an exemplary side-view image 600 of a substrate before the UV irradiation of the substrate in a test. The side-view image 600 of a repeating structure after a post-etch process and prior to the two-step cleaning method comprising a pre-treatment UV irradiation process and a subsequent wet clean process. The repeating structure 604 is characterized by the width 608 and a height 612. FIG. 6B depicts an exemplary side-view image 630 of the substrate after the pre-treatment UV irradiation. Cleaning of the substrate layer starts as evidenced by the smaller width 638 and a higher height 642 of the partially cleaned repeating structure 634. FIG. 6C is an exemplary side-view image 660 of the substrate after the pre-treatment UV process and the subsequent wet clean process are complete. Cleaning of the post etch substrate is substantially complete as evidenced by the removal of the polymer and resist layers (layers 204 and 208 in FIG. 2), and the target critical dimensions, such as the target width 672 and the target height 668 of the substantially cleaned repeating structure 664, are achieved.

It is known in the art that the sole use of the wet clean process does not consistently clean the polymer completely. The pre-treatment process using UV light coupled with the wet clean process has proved to increase the operating window of the cleaning chemistry to remove challenging post etch polymer. As the residues at the back-end-of line include more fluorinated residue, it is more difficult to remove this residue with wet chemistry alone. Several technical trends increase the potential value of the UV pre-treatment. First, due to the lower k-value of film with increased porosity and changes in film deposition and cure, the use of the pre-treatment UV irradiation makes the film more sensitive to cleaning chemistry. Specifically for reactive ion etching (RIE), the process development due to ultra-low k (ULK) materials and scaling of organic residue leads to post etch polymer composition changes that require expensive and time consuming reformulation of the post etch clean chemistry. This time consuming reformulation can be avoided using the two step method described in this application. The inventor found that the pre-treatment process using UV light and process gas can completely perform 100% cleaning of the polymer. In this invention, the percentage of cleaning with the pre-treatment process is intentionally set to less than 100 percent in order to minimize the change in the k-value of the underlying dielectric or keep the k-value change inside the acceptable range for the substrate application. The goal of the pre-treatment process is not to completely remove the polymer layer but to chemically modify the post etch polymer to make it easier to remove with a wet clean process while eliminating damage to the underlying dielectric. Optimization of the two or more operating variables in the pre-treatment process allows for a more consistent completion of cleaning of the substrate by a subsequent wet clean process.

FIG. 7 is an exemplary flow chart 700 for a method of cleaning a substrate using a pre-treatment process using UV light and a wet clean process in an embodiment of the present invention. In operation 704, one or more pre-treatment objectives are selected for a pre-treatment system of a cleaning system. Examples of pre-treatment objectives include pre-treatment cleaning percentage, pre-treatment first process time, total cost of ownership, change of k-value, and the like. The pre-treatment cleaning percentage can be in the range of 50 to 99%, the first process time can be 120 seconds or less, and the change in k-value can be 0.2 or less.

In operation 708, two or more pre-treatment operating variables are selected and optimized towards achieving the two or more pre-treatment objectives. The selected two or more pre-treatment operating variables can include two or more of UV dose, substrate temperature, pre-treatment cleaning percentage, oxygen partial pressure, oxygen and ozone partial pressure, first process time, or total process gas pressure. The UV dose can be in a range from 0.1 to 20.0 J/cm$^2$, the oxygen partial pressure can be from 15 to 159 Torr, the total process gas pressure can be 80 to 760 Torr, the substrate temperature can be from 25 to 150° C., and the k-value of the underlying dielectric can be from 2.0 to 2.6.

In operation 712, a substrate having a layer to be cleaned and an underlying dielectric layer is provided for processing, the underlying dielectric having a k-value. In operation 716, a pre-treatment process gas is delivered onto a surface of the substrate in the processing chamber of the cleaning system, using a gas delivery system. The process gas can include oxygen or oxygen and ozone at a specific ratio of ozone to oxygen. Alternatively, the process gas can be filtered air or clean dry air (CDA). In operation 720, the process gas is irradiated with a UV device to generate radicals for a pre-treatment of the substrate, where the irradiation is completed during a pre-treatment first process time, and the UV device having one or more wavelengths and a UV dose. In operation 724, the selected two or more pre-treatment variables are controlled using one or more metrology measurements in the pre-treatment system in order to meet the one or more pre-treatment objectives. In operation 728, a wet clean process is performed on the substrate using the wet clean system. The wet clean system can use a variety of chemistries including sulfuric acid and hydrogen peroxide (SPM), SPM with ozone (SPOM), phosphoric acid and steam, ammonium hydroxide and hydrogen peroxide, dilute hydrofluoric acid (DHF), deionized water and ozone, dimethyl sulfoxide and monoethanol amine (DMSO/MEA), or other wet clean chemistries.

FIG. 8 is an exemplary flow chart 800 of a method of controlling a cleaning system using selected cleaning operating variables in an embodiment of the present invention. In operation 804, measurements for calculating a value of the one or more pre-treatment objectives are obtained. The measurements can include obtaining the top view images of the substrates during the pre-treatment process to check the cleaning progress, check the percentage of post etch polymer removal, check the elapsed first process time, check the composition of the process gas, UV dose, or the rotation speed of the substrate. In operation 808, the calculated values of the one or more pre-treatment objectives are compared with the set one or more pre-treatment objectives. Calculation of the values of the one or more pre-treatment objectives can include calculating the change in k-value, the percentage of cleaning in the pre-treatment process, or the cost of ownership based on projected unit throughput of substrates. In operation 812, if the one or more objectives are not met, the two or more selected operating variables are adjusted until the one or more pre-treatment objectives are met. For example, the UV dose can be adjusted to increase or decrease the percentage of cleaning in the pre-treatment process. The substrate temperature, the flow rate of oxygen and/or ozone, or partial pressure of the oxygen and/or ozone may be adjusted to increase the oxygen radical or atomic oxygen in the process gas or the ratio of ozone to oxygen. The first process time may be shortened to minimize change of k-value or lengthened to ensure higher percentage of cleaning.

FIG. 9 is an exemplary diagram 900 for a cleaning system 902 where the UV source 904 is located above a diffusion plate 924, the diffusion plate 924 configured to block 185 nm wavelength light to irradiate the substrate 932 during the pre-treatment process and protect the UV source 904 and associated equipment during the subsequent wet clean process. The process gas 912 can comprise oxygen and/or nitrogen. Alternatively, the process gas can comprise oxygen and/or nitrogen and/or ozone. In another embodiment, fan filter unit (FFU) air or CDA 920 can be introduced into the process chamber 916 as the process gas during the pre-treatment process. During the wet clean process, the treatment liquid 944 delivered into the process chamber 916 by delivery device 936 onto the substrate 932, where the treatment liquid 944 and the process gas 912 or 920 are removed through exhaust units 940, 928. The system hardware for the substrate cleaning system is simplified because there is no requirement for an external oxygen or ozone containing oxygen gas feed into the UV chamber. Processing with standard air has demonstrated the ability to generate sufficient ozone and oxygen atoms for the pre-treatment process to work. Feeding oxygen or ozone carrying gas lines increases tool cost because of the associated hardware design safety requirements. The inventor found out that significantly shorter UV exposure times can be realized by the combined pre-treatment process using UV and a process gas followed by a wet clean process. Further, the inventor was also able to shorten the wet clean process time. Moreover, the generation of in-situ process gas also reduces the number of UV sources employed in the design of the substrate cleaning system. For example, all UV hardware in FIG. 9 is contributing directly to the cleaning of the substrate, ultimately to the generation of atomic oxygen.

Referring to FIG. 9, an embodiment of the invention includes an indirect source of ozone generated either by vacuum UV (VUV) sources (<200 nm), corona discharge or UV source with wavelengths below 200 nm fed into the substrate processing chamber while under irradiation with 254 nm only radiation. The absorption of the radiation by the ozone initiates the formation of oxygen atoms at the substrate surface that enable the damage-free cleaning of substrates. Alternatively, in another embodiment, the substrate is irradiated with ozone emitting UV where an 185 nm absorbing filter is placed between the substrate with geometry that prevents direct and indirect illumination with 185 nm but allows a diffusion path for ozone to reach the substrate surface. Mass transport of the process gas can be enhanced by flowing the oxygen filled atmosphere through the <200 nm wavelength absorbing gas diffusion plate.

FIG. 10 is an exemplary architectural diagram 1000 of a cleaning system 1004 depicting use of a controller 1090 for optimizing the operating variables of the cleaning system 1004 towards meeting the one or more pre-treatment objectives. The cleaning system 1004 can use two or more optical metrology measurement devices 1008. An optical emission spectroscopy (OES) device 1070 can be coupled to the processing chamber 1010 at a position to measure the optical emission from the processing region 1015. In addition, another set of optical metrology devices 1060 can be disposed atop the processing chamber 1010. Although four optical metrology devices are shown, many other alternative and different configurations of the optical metrology devices can be positioned to implement design objectives using a plurality of optical metrology devices. The four optical metrology devices 1060 can be spectroscopic reflectometric devices and/or interferometric devices. The measurements from the two or more optical metrology measurement devices 1008, for example, the OES device 1070 and the set of optical metrology devices 1060, are transmitted to the metrology processor (not shown) where one or more critical dimension values are extracted. Measurements can be performed OES device 1070 and/or the set of optical metrology devices 1060 and one or more etch sensor devices, 1064 and 1068.

As mentioned above, a process sensor device, for example, can be a residue sensor device 1064 measuring the percentage of residue remaining on the substrate 1025, or measuring a cleaning operating variable with a substantial correlation to percentage of residue removal. Another process sensor device can include a device measuring the partial pressure of oxygen or the oxygen and ozone partial pressures or the total pressure of the process gas. Selection of at least one or more process sensor devices can be done using multivariate analysis using sets of process data, metrology data (diffraction signals) and process performance data to identify these inter-relationships. The measurements from the two or more optical metrology measurement devices 1008, for example, the OES device 1070 and the set of optical metrology devices 1060 and the measurement from the sensor device 1064 and/or 1068 are transmitted to the metrology processor (not shown) where the operating variable values are extracted.

Still referring to FIG. 10, the cleaning system 1004 includes a controller 1090 coupled to sub-controllers 1096 in the two or more optical metrology measurement devices 1008 comprising a plurality of optical metrology devices 1060, optical emission spectroscopy (OES) device 1070, and one or more etch sensor devices, 1064 and 1068. One or more chemical monitors 1092 can be coupled to the processing chamber to ensure the process gas is within the ranges set. Another sub-controller 1094 can be included in the motion control system 1020 that is coupled to the controller 1090 and can adjust the first and second speed of the rotation of the motion control system for a single substrate tool. The controller 1090 can be connected to an intranet or via the Internet to other controllers in order to optimize the cleaning operating variables and in order to achieve the one or more pre-treatment objectives.

Although only certain embodiments of this invention have been described in detail above, those skilled in the art will readily appreciate that many modifications are possible in the embodiments without materially departing from the novel teachings and advantages of this invention. For example, although one exemplary process flow is provided for cleaning of substrates, other process flows are contemplated. As also mentioned above, the cleaning method and system of the present invention can be used in an FEOL or BEOL fabrication cluster. Accordingly, all such modifications are intended to be included within the scope of this invention.

What is claimed:

1. A method for cleaning a substrate in a cleaning system, the cleaning system comprising a pre-treatment system and a wet clean system, the pre-treatment system including a processing chamber and a gas delivery sub-system, the method comprising:
    selecting one or more pre-treatment objectives for the pre-treatment system;
    selecting two or more pre-treatment operating variables to be optimized for achieving the one or more pre-treatment objectives;
    providing a substrate having a layer to be cleaned and an underlying dielectric layer, the underlying dielectric layer having a k-value;
    delivering a pre-treatment gas onto a surface of the substrate in the processing chamber using the gas delivery sub-system; and
    irradiating the pre-treatment gas with an ultra-violet (UV) device and generating radicals for pre-treatment of the substrate, the irradiation completed during a pre-treatment first process time, the UV device having one or more dominant emission wavelengths and a UV dose;
    obtaining one or more metrology measurements in the pre-treatment system during the irradiating; and
    controlling the selected two or more pre-treatment operating variables during the irradiating using the obtained one or more metrology measurements in the pre-treatment system to achieve the selected one or more pre-treatment objectives;
    wherein the pre-treatment gas comprises oxygen or oxygen and ozone and wherein the two or more pre-treatment operating variables comprises two or more of the light UV dose, substrate temperature, first process time, oxygen partial pressure, oxygen and ozone partial pressure, and/or total process gas pressure; and
    wherein the one or more pre-treatment objectives includes a pre-treatment cleaning percentage that is selected to be less than 100 percent.

2. The method of claim 1 wherein the one or more pre-treatment objectives includes a target total cost of ownership for the pre-treatment system and the wet clean system or a target change in k-value.

3. The method of claim 1 wherein the pre-treatment cleaning percentage is selected to be in a range from 50 to 99 percent.

4. The method of claim 1 wherein the pre-treatment irradiation duration is less than 120 seconds.

5. The method of claim 1 wherein the pre-treatment cleaning percentage is selected to be in a range from 50 to 99 percent and the pre-treatment irradiation duration is less than 120 seconds.

6. The method of claim 1 wherein the one or more pre-treatment objectives includes a target total cost of ownership of the pre-treatment system and the wet clean system, first process time, and change of k-value.

7. The method of claim 1 wherein:
    the total cost of ownership for the combined pre-treatment system and wet clean system is selected to be less than the cost of cleaning the substrate using a wet clean system only;
    the first process time is less than 120 seconds; and/or
    the change of k-value of the underlying dielectric is selected to be 0.2 or less.

8. The method of claim 1 wherein the delivering the pre-treatment gas utilizes ozone and oxygen atoms generated from air, or oxygen with an indirect source of ozone, wherein the ozone is generated by vacuum UV sources or a corona discharge.

9. The method of claim 8 where the ozone is generated by a UV source with emission wavelengths below 240 nm fed into the processing chamber while the substrate is under irradiation with a 254 nm only dominant emission wavelength.

10. The method of claim 9 wherein the pre-treatment gas is delivered and mixed in the processing chamber and wherein the UV source is located above a gas diffusion plate, the gas diffusion plate configured to block 185 nm dominant emission wavelength light from irradiating the substrate during the pre-treatment process, to allow the pre-treatment gas and the 254 nm dominant emission wavelength to pass through, and to protect the UV source and associated equipment during the subsequent wet clean process.

11. The method of claim 9 wherein the processing chamber is configured to function as a reaction chamber during the pre-treatment process and during the subsequent wet clean process.

12. The method of claim 1 wherein the UV device is one or more low pressure Hg lamps.

13. The method of claim 12 wherein the UV device has two dominant emission wavelengths, a first dominant emission wavelength of 185 nm and a second dominant emission wavelength of 254 nm.

14. The method of claim 13 wherein the UV device utilizes a gas diffusion plate to absorb irradiation from the 185 nm dominant emission wavelength while allowing the pre-treatment gas and the second dominant emission wavelength of 254 nm to pass through.

15. The method of claim 1 wherein the k-value of the dielectric layer is in the range of 2.0 to 2.6 and/or the substrate temperature is in a range from 25 to 150 degrees C.

16. The method of claim 1 wherein the oxygen partial pressure is in a range of 15 to 159 Torr and/or the total process gas pressure is in a range from 80 to 760 Torr.

17. The method of claim 1 wherein the UV dose is in a range from 0.1 to 20.0 J/cm$^2$.

18. The method of claim 1 further comprising performing a wet clean process using the wet clean system, after completion of the pre-treatment process.

19. The method of claim 18 wherein the wet clean system is performed using an immersion clean process with a treatment liquid for the wet clean process, the immersion clean process using aqueous, semi-aqueous, or full solvent chemistry.

20. The method of claim 19 where the treatment liquid comprises one or more of ammonium hydroxide ($NH_4OH$) and hydrogen peroxide ($H_2O_2$), dilute hydrogen fluoride (DHF), deionized water (DIW) and ozone ($O_3$), or dimethylsulfonide (DMSO) or mono-ethylamine (MEA).

21. The method of claim 20 further comprising recycling the treatment liquid.

22. The method of claim 18 wherein the wet clean process is performed on a single wafer system.

23. The method of claim 18 wherein the pre-treatment process is performed using first single wafer system and the wet clean process is performed using a second single wafer system or wherein the pre-treatment process and the wet clean process are performed using the same single wafer system.

24. The method of claim 1 wherein the cleaning system is part of a front-end-of-line fabrication cluster or a back-end-of-line fabrication cluster.

25. The method of claim 1,
wherein controlling the selected two or more pre-treatment operating variables using the obtained one or more metrology measurements includes adjusting the selected two or more pre-treatment operating variables during the irradiating to achieve the selected one or more pre-treatment objectives.

26. A method for cleaning a substrate in a cleaning system, the cleaning system comprising a pre-treatment system and a wet clean system, the pre-treatment system including a processing chamber, a gas delivery sub-system and a gas diffusion plate, the method comprising:
providing a substrate having a polymer-containing layer to be removed and an underlying dielectric layer, the underlying dielectric layer having a k-value;
selecting a set of pre-treatment objectives including a cleaning percentage of less than 100 percent removal of the polymer-containing layer and a change of k-value of the underlying dielectric of 0.2 or less;
delivering a pre-treatment gas comprising oxygen into the processing chamber using the gas delivery sub-system;
irradiating the pre-treatment gas with an ozone-generating ultra-violet (UV) device having at least 185 nm and 254 nm dominant emission wavelengths and generating oxygen radicals for pre-treatment of the substrate, the irradiating completed during a pre-treatment first process time at a UV dose;
obtaining one or more metrology measurements in the pre-treatment system during the irradiating; and
controlling two or more pre-treatment operating variables during the irradiating based on the one or more metrology measurements obtained during the irradiating to achieve the selected set of pre-treatment objectives,
wherein the two or more pre-treatment operating variables comprise two or more of the UV dose, substrate temperature, the pre-treatment first process time, oxygen partial pressure, oxygen and ozone partial pressure, and/or total process gas pressure, and
wherein the gas diffusion plate is configured to block the 185 nm dominant emission wavelength from irradiating the substrate during the irradiating of the pre-treatment gas.

27. The method of claim 26 wherein the irradiating is for less than 120 seconds.

28. The method of claim 26 wherein the set of pre-treatment objectives includes a total cost of ownership for the combined pre-treatment system and wet clean system that is selected to be less than the cost of cleaning the substrate using a wet clean system only.

29. The method of claim 26 wherein the k-value of the dielectric layer is in the range of 2.0 to 2.6 and the substrate temperature is in a range from 25 to 150 degrees C.

30. The method of claim 26 wherein the oxygen partial pressure is in a range of 15 to 159 Torr and/or the total process gas pressure is in a range from 80 to 760 Torr.

31. The method of claim 26 wherein the UV dose is in a range from 0.1 to 20.0 J/cm$^2$.

32. The method of claim 26 wherein the pre-treatment gas is delivered and mixed in the processing chamber and wherein the UV device is located above the gas diffusion plate, the gas diffusion plate further configured to protect the UV device and associated equipment during the subsequent wet clean process.

33. A method for cleaning a substrate in a cleaning system, the cleaning system comprising a pre-treatment system and a wet clean system, the pre-treatment system including a processing chamber, a gas delivery sub-system and a gas diffusion plate, the method comprising:
providing a substrate having a polymer-containing layer to be removed and an underlying dielectric layer, the underlying dielectric layer having a k-value;
selecting a set of pre-treatment objectives including a cleaning percentage of less than 100 percent removal of the polymer-containing layer and a change of k-value of the underlying dielectric of 0.2 or less;
delivering a pre-treatment gas comprising oxygen into the processing chamber above the gas diffusion plate using the gas delivery sub-system;
irradiating the pre-treatment gas with an ozone-generating ultra-violet (UV) device positioned above the gas diffusion plate and having at least two dominant emission wavelengths including a first wavelength emission below 200 nm and a second wavelength emission of 254 nm, wherein the irradiating generates ozone and oxygen radicals, and wherein the gas diffusion plate is configured to diffuse ozone and oxygen radicals through to the substrate for pre-treatment of the substrate with the oxygen radicals, to allow the second wavelength emission to pass through the gas diffusion plate to generate oxygen radicals from the diffused ozone, and to block the first wavelength emissions from passing through the gas diffusion plate to prevent the first wavelength emissions from irradiating the substrate;

obtaining one or more metrology measurements in the pre-treatment system during the irradiating; and controlling two or more pre-treatment operating variables during the irradiating based on the one or more metrology measurements obtained during the irradiating to achieve the selected set of pre-treatment objectives, wherein the two or more pre-treatment operating variables comprise two or more of UV dose, substrate temperature, pre-treatment process time, oxygen partial pressure, oxygen and ozone partial pressure, and/or total process gas pressure.

* * * * *

UNITED STATES PATENT AND TRADEMARK OFFICE
CERTIFICATE OF CORRECTION

PATENT NO. : 9,966,280 B2
APPLICATION NO. : 13/783382
DATED : May 8, 2018
INVENTOR(S) : Ian J. Brown It is certified that error appears in the above-identified patent and that said Letters Patent is hereby corrected as shown below:

On the Title Page

On Page 2, Column 2, OTHER PUBLICATIONS, Line 4, "implanted resists by Uv activated hydrogen peroxide solutions" should read --implanted resists by UV activated hydrogen peroxide solutions--.

On Page 2, Column 2, OTHER PUBLICATIONS, Line 15, "State Intellectual Property Office of People'S Republic of China," should read --State Intellectual Property Office of People's Republic of China,--.

In the Specification

In Column 4, Line 13, "dotted line 316 and the solid line 320 represents points of" should read --dotted line 316 and the solid line 320 and represents points of--.

In Column 4, Line 44, "and the long-and-short-dash line 420 represents points of" should read --and the long-and-short-dash line 420 and represents points of--.

In Column 5, Line 17, "long-dash line 520 represents points of UV dose and" should read --long-dash line 520 and represents points of UV dose and--.

In Column 6, Line 6, "The side-view image 600 of a repeating structure after a" should read --The side-view image 600 is of a repeating structure after a--.

In Column 8, Lines 12-13, "the treatment liquid 944 delivered into the process" should read --the treatment liquid 944 is delivered into the process--.

In Column 9, Lines 4-5, "Measurements can be performed OES device 1070" should read --Measurements can be performed using OES device 1070--.

Signed and Sealed this
Ninth Day of October, 2018

Andrei Iancu
*Director of the United States Patent and Trademark Office*

CERTIFICATE OF CORRECTION (continued)
U.S. Pat. No. 9,966,280 B2

In the Claims

In Column 10, Line 18, Claim 1, "treatment operating variables comprises two or more of" should read --treatment operating variables comprise two or more of--.

In Column 11, Line 30, Claim 19, "The method of claim 18 wherein the wet clean system" should read --The method of claim 18 wherein the wet clean process--.

In Column 11, Lines 38-39, Claim 20, "or dimethyl-sulfonide (DMSO)" should read --or dimethyl-sulfoxide (DMSO)--.